United States Patent
Kusano et al.

(10) Patent No.: US 6,369,331 B1
(45) Date of Patent: Apr. 9, 2002

(54) PRINTED CIRCUIT BOARD FOR SEMICONDUCTOR PACKAGE AND METHOD OF MAKING SAME

(75) Inventors: Kiyoharu Kusano; Kyoko Miyazima, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/536,992

(22) Filed: Mar. 29, 2000

(30) Foreign Application Priority Data

Sep. 1, 1999 (JP) ............................................ 11-247120

(51) Int. Cl.⁷ ................................................ H05K 1/16
(52) U.S. Cl. .................... 174/260; 174/252; 174/254; 174/258; 174/261; 361/760; 361/749; 361/783; 361/799; 257/706; 257/713; 257/738
(58) Field of Search .................. 174/260, 254, 174/255, 256, 257, 258, 259, 261, 264, 252; 361/760, 749, 750, 751, 783, 799, 717, 704, 705, 713, 777, 790, 792; 257/706, 707, 713, 737, 738, 784, 778, 779, 702

(56) References Cited

U.S. PATENT DOCUMENTS

| | | | | |
|---|---|---|---|---|
| 4,677,252 A | * | 6/1987 | Takahashi et al. | 174/254 |
| 5,206,795 A | * | 4/1993 | Belanger, Jr. | 361/798 |
| 5,229,916 A | * | 7/1993 | Frankeny et al. | 361/718 |
| 5,375,041 A | * | 12/1994 | McMahon | 361/749 |
| 5,581,122 A | * | 12/1996 | Chao et al. | 257/691 |
| 5,693,980 A | * | 12/1997 | Sugahara | 257/706 |
| 5,895,970 A | * | 4/1999 | Miyoshi | 257/696 |
| 5,962,917 A | * | 10/1999 | Moriyama | 257/697 |
| 5,963,427 A | * | 10/1999 | Bollesen | 361/704 |
| 5,973,395 A | * | 10/1999 | Suzuki et al. | 257/692 |
| 6,028,365 A | * | 2/2000 | Akaram et al. | 257/778 |

FOREIGN PATENT DOCUMENTS

| | | |
|---|---|---|
| JP | 8-31868 | 2/1996 |
| JP | 8-204103 | 8/1996 |

* cited by examiner

Primary Examiner—Albert W. Paladini
Assistant Examiner—I B Patel
(74) Attorney, Agent, or Firm—Armstrong, Westerman & Hattori, LLP

(57) ABSTRACT

A printed circuit board comprises an insulator film extending over the front surface of a substrate. The insulator film is designed to bend around the outer periphery of the substrate so as to reach the back surface of the substrate. A wiring pattern is printed on the surface of the insulator film so as to extend over the front and back surfaces of the substrate. The wiring pattern serves to electrically connect the opposite surfaces, namely, the front and back surfaces of the printed circuit board without a conductive through hole or via. Even if input/output pins of the semiconductor chip are increased, it is possible to avoid a deteriorated efficiency and an increased cost in production.

11 Claims, 4 Drawing Sheets

PRINTED CIRCUIT BOARD FOR SEMICONDUCTOR PACKAGE AND METHOD OF MAKING SAME

BACKGROUND OF THE INVENTION

1. Field of the Invention

The present invention relates to a semiconductor package such as a ball grid array (BGA), in particular, to a printed circuit board employed in such a semiconductor package.

2. Description of the Prior Art

In general, a BGA employs conductive through holes or vias so as to electrically connect a semiconductor chip, mounted on the front surface of a substrate, and solder balls attached to the back surface of the substrate. An increased number of input/output pins arranged on the semiconductor chip inevitably induces increased through holes. The increase of the through holes may hinder realization of a high-density and fine printed wiring pattern on the substrate. In addition, production efficiency may be deteriorated and cost in production may be increased.

For example, Japanese Patent Laid-open No. 8-31868 discloses a semiconductor package, a BGA, comprising a semiconductor chip and solder balls electrically connected to each other without employment of through holes. The disclosed BGA is designed to employ a printed circuit board comprising a folded insulated film of synthetic resin. A printed wiring pattern is formed over the surface of the insulated film. Electric connection can thus be achieved between the semiconductor chip and the solder balls via the printed circuit pattern, not through holes, in the BGA. However, the BGA may suffer from an insufficient rigidity of the printed circuit board. Stress applied to the BGA may induce deformation of the semiconductor chip, which possibly disconnects the electric connection between the semiconductor chip and the printed circuit board.

Another example of a BGA is disclosed in Japanese Patent Laid-open No. 8-204103. This BGA tries to maintain the rigidity of a printed circuit board even when a semiconductor chip and solder balls are electrically connected to each other without employment of through holes. The BGA is designed to employ a multilayered printed circuit board comprising a metallic plate, an insulator layer and a printed pattern film. The metallic plate serves to exhibit a higher rigidity. However, folding of the high rigidity metallic plate may deteriorate production efficiency.

SUMMARY OF THE INVENTION

It is accordingly an object of the present invention to provide a printed circuit board capable of electrically connecting a semiconductor chip and an input/output terminal on opposite surfaces of a substrate without employment of a through hole, at a lower production cost and a higher production efficiency.

According to the present invention, there is provided a printed circuit board for a semiconductor package, comprising: a substrate having a front surface and a back surface; an insulator film extending over the front surface and bent around an outer periphery of the front surface so as to reach the back surface; and a wiring pattern printed on the insulator film so as to extend over the front and back surfaces.

With the above structure, the wiring pattern serves to electrically connect the opposite surfaces, namely, the front and back surfaces of the printed circuit board. Employment of such a wiring pattern allows establishment of signal paths between the front and back surfaces of the printed circuit board without a conductive through hole or via. If the printed circuit board is employed in a semiconductor package such as ball grid array (BGA), for example, the wiring pattern may serve to facilitate establishment of electric connection between a semiconductor chip, mounted on the front surface of the printed circuit board, and a plurality of conductive balls such as solder balls and gold balls, formed or attached to the back surface of the printed circuit board. It is not required to form conductive through holes or vias. Even if input/output pins of the semiconductor chip are increased, it is possible to avoid a deteriorated efficiency and an increased cost in production.

A rigid body is preferably employed as a substrate. Such a rigid body may include a conventional resin plate, a copper plate, an aluminum plate, a ceramic plate, and the like, for example. When enough rigidity can be found in the substrate, the semiconductor package is reliably prevented from deformation. The semiconductor package can be grasped relatively hard. In addition, a wire bonding can be achieved easily.

The printed circuit board preferably further comprises a lining of a metallic thin film backing the insulator film. In the case where a synthetic resin is used to provide the insulator film, the metallic thin film may contribute to reinforcement of rigidity of the insulator film. If the synthetic resin insulator film is formed on the surface of the metallic thin film, the metallic thin film along with the insulator film can be rolled up onto a roll. Handling of the relatively fragile insulator film can be facilitated. It is preferable to keep enough flexibility in the metallic thin film even after the insulator film or membrane is coated on the surface of the metallic thin film.

In particular, when a metallic plate of a higher heat conduction is employed as the substrate, it is preferable to define an opening in the insulator film and/or the metallic thin film so as to expose the front surface of the metallic plate. If the semiconductor chip is disposed within the opening so as to directly contact the metallic plate, heat radiation from the semiconductor chip can be promoted through the heat conduction of the metallic plate. A heat sink, a heat pipe, or any other type of heat radiation mechanism may be added or attached to the metallic plate.

In addition, the conductive metallic thin film may be utilized as a ground pattern or layer. If the wiring pattern is connected to the ground pattern, a structure similar to a micro strip line can easily be established, so that a signal line can be prevented from suffering from noise crossing over adjacent signal lines.

When the aforementioned printed circuit board is to be produced, a method according to the invention may comprise: forming an insulator membrane on a front surface of a film; forming a conductive wiring pattern on a surface of the insulator membrane; attaching a core on a back surface of the film; folding a part of the film around an outer periphery of the core; and bonding the part at a back of the core, for example.

Such a method serves to establish signal lines between the opposite surfaces, namely, the front and back surfaces of the core without folding or bending the core itself. It is accordingly possible to avoid a deteriorated production efficiency due to folding or bending of the relatively high rigidity core. The core may include a metallic plate such as a copper plate and an aluminum plate in addition to a substrate such as a synthetic resin plate and a ceramic plate. The core need not be a rigid body in this case.

The film may take the form of ribbon. The film in the form of ribbon may be rolled up onto a roll after the conductive wiring pattern has been formed. Employment of the roll serves to facilitate handling of the film at factories.

BRIEF DESCRIPTION OF THE DRAWINGS

The above and other objects, features and advantages of the present invention will become apparent from the following description of the preferred embodiments in conjunction with the accompanying drawings, wherein.

DESCRIPTION OF THE PREFERRED EMBODIMENTS

Figure 1:
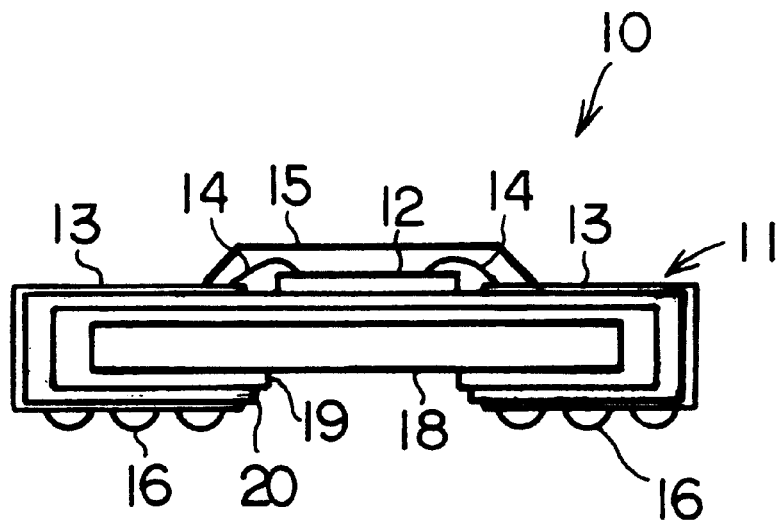
FIG. 1 is a side view schematically illustrating the structure of a ball grid array (BGA) according to a first embodiment of the present invention.

FIG. 1 schematically illustrates a semiconductor package according to a first embodiment of the present invention. The semiconductor package or ball grid array (BGA) 10 comprises a printed circuit board 11 and a semiconductor chip 12 mounted on the front or upper surface of the printed circuit board 11. A conductive printed pattern or wiring pattern 13 extends over the front surface of the printed circuit board 11. Gold wires 14 are designed to electrically connect input/output terminals of the semiconductor chip 12 and corresponding portions or input/output pads of the wiring pattern 13. The semiconductor chip 12 and the gold wires 14 are sealed within a hardened resin 15.

A plurality of solder balls 16 are attached to the back or lower surface of the printed circuit board 11. The solder balls 16 may be arranged in a lattice pattern, for example. The respective input/output terminals of the semiconductor chip 12 are electrically connected to the corresponding solder balls 16 through wires included in the wiring pattern 13, as described later in detail. As is conventionally known, when the BGA 10 is mounted on a printed circuit board, not shown, in a multi-chip module (MCM) or a motherboard, the solder balls 16 are designed to melt on input/output pads arranged on the printed circuit board. The solder balls 16 are thereafter caused to harden by a cooling treatment. The hardened solder balls 16 serve to fixedly hold the BGA 10 on the input/output pads. In this manner, an electric connection can be achieved between the semiconductor chip 12 in the BGA 10 and the printed circuit board in the MCM or motherboard.

As is apparent from FIG. 1, the printed circuit board 11 comprises a metallic plate 18 as a core or substrate, and a flexible metallic thin film 19 extending over the front or upper surface of the metallic plate 18. The metallic thin film 19 is designed to bend around the outer periphery of the metallic plate 18 so as to reach the back or lower surface of the metallic plate 18. A flexible insulator film or membrane 20 is layered over the surface of the metallic thin film 19. The metallic thin film 19 thus functions as a lining backing the insulator membrane 20. The aforementioned wiring pattern 13 is formed to extend over the surface of the insulator membrane 20. The wiring pattern 13 thus extends over both the opposite surfaces, namely, the front and back surfaces around the outer periphery of the metallic plate 18.

Here, the core or substrate may include not only the aforementioned metallic plate 18 such as a copper plate and an aluminum plate but also a synthetic resin plate or a ceramic plate. The core or substrate is preferably designed to have a rigidity enough to avoid deformation when stress is applied to the core or substrate. Enough rigidity can be achieved, for example, in a copper or an aluminum plate of approximately 0.5 mm to 1.0 mm thickness. On the other hand, the metallic thin film 19 may include a stainless steel thin film, for example. The insulator film or membrane 20 may include a flexible synthetic resin coating, for example.

The wiring pattern 13 is adapted to establish an electric connection between the semiconductor chip 12, on the front surface of the printed circuit board 11, and the solder balls 16 on the back surface of the printed circuit board 11, in the BGA 10. A through hole is not required in the printed circuit board 11. Even when an increased number of input/output pins are arranged on the semiconductor chip 12, it is possible to avoid a deteriorated production efficiency and an increased production cost.

Figure 2:
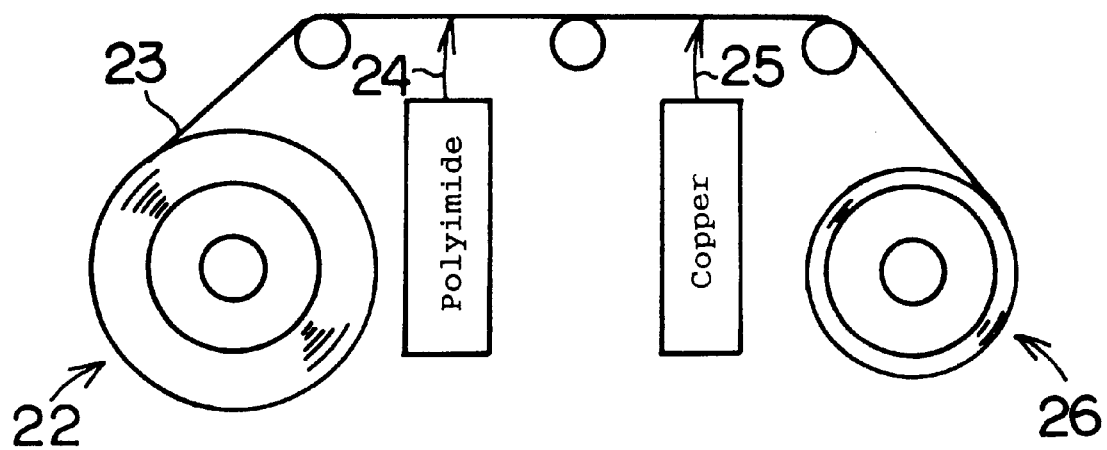
FIG. 2 schematically illustrates a method of making a printed circuit board employed in the BGA.

Next, a brief description will be made on production of the printed circuit board 11. First of all, as shown in FIG. 2, a ribbon 23 of stainless steel rolled around a first roll 22 is prepared. The ribbon 23 may have a thickness of approximately 25 μm, for example. Liquid of photosensitive polyimide 24 is applied to the front surface of the ribbon 23 released from the first roll 22. When the polyimide 24 is hardened on the ribbon 23, the insulator membrane or coating 20 can be obtained on the surface of the ribbon 23. The insulator membrane 20 may have a thickness of approximately 40 μm, for example.

Subsequently, a copper 25 is applied to the surface of the insulator membrane 20. The wiring pattern 13 is thus printed and formed by the copper 25. An electrodeposition may be employed to form the wiring pattern 13. Since the ribbon 23 and the insulator membrane 20 have the aforementioned thickness, the ribbon 23 including the copper wiring pattern 13 has a flexibility enough to be rolled up onto a second roll 26. Employment of the first and second rolls 22, 26 serves to facilitate handling of the ribbon 23 at factories.

Figure 3:
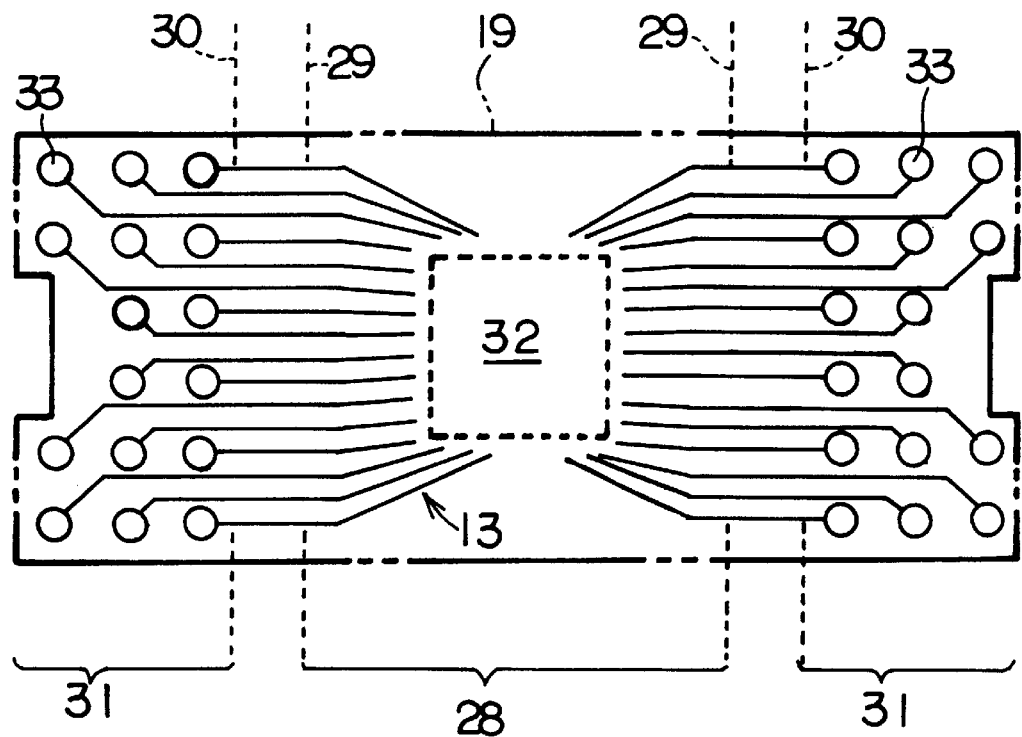
FIG. 3 is a plan view of a metallic thin film for illustrating a printed wiring pattern.

The metallic thin film 19 is punched out of the ribbon 23 of stainless steel prepared in the above-described manner. As shown in FIG. 3, a main section 28 is then defined by a pair of fold lines 29, 29 extending on the surface of the metallic thin film 19. The main section 28 is expected to be superposed on the front surface of the metallic plate 18. Likewise, a pair of bent sections 31, 31 are defined by fold lines 30, 30 extending on the surface of the metallic thin film 19. The spacing between the adjacent fold lines 29, 30 may be set to correspond to the thickness of the metallic plate 18. The respective wires of the wiring pattern 13 begin at the periphery of a central square region 32 for receiving the semiconductor chip 12 within the main section 28, and extend to reach corresponding pads 33 for receiving the solder balls 16 on the bent sections 31, 31. The solder balls 16 are formed or attached to the respective pads 33.

The metallic thin film 19 is thereafter superposed on the metallic plate 18, namely, a rigid core. The back surface of the metallic thin film 19 behind the main section 28 is bonded to the front surface of the metallic plate 18. The bent sections 31, 31 of the metallic thin film 19 are folded around the outer periphery of the metallic plate 18 at the fold lines 29, 30. The bent sections 31, 31 can thus be superposed on the back surface of the metallic plate 18. The metallic thin film 19 may be folded at right angles at the fold lines 29, 30, respectively. Such a moderate angle serves to prevent the wiring pattern 13 on the surface of the insulator membrane 20 from suffering from disconnection. The bent sections 31, 31 are then bonded to the back surface of the metallic plate 18, respectively. Production of the printed circuit board 11 has been completed.

Figure 4:
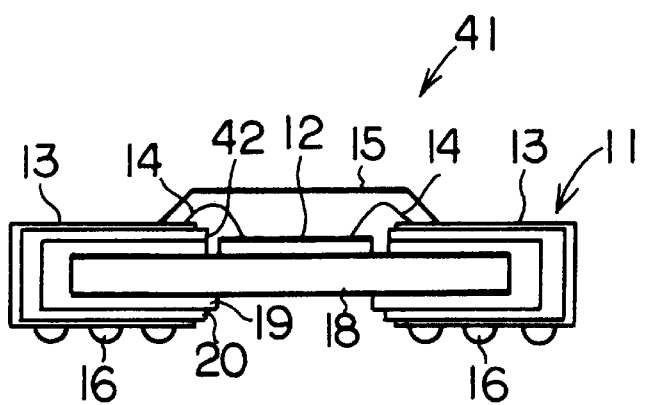
FIG. 4 is a side view schematically illustrating the structure of a BGA according to a second embodiment of the present invention.

FIG. 4 schematically illustrates a semiconductor package or BGA 41 according to a second embodiment of the present invention. In this second embodiment, an opening 42 is defined in the metallic thin film 19 and the insulator membrane 20 at the front surface of the printed circuit board 11. The opening 42 serves to expose the front surface of the metallic plate 18. The semiconductor chip 12 is disposed within the opening 42. Note that like reference numerals are attached to structure or components achieving function or advantages identical to those in the aforementioned first embodiment.

Figure 5:
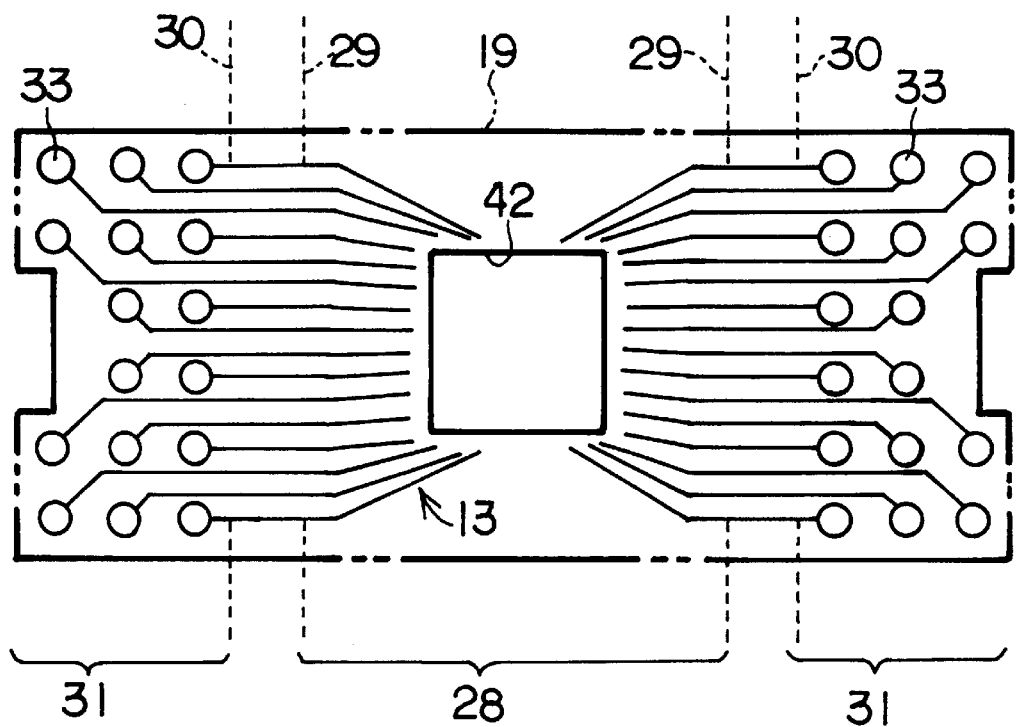
FIG. 5 illustrates a plan view of a metallic thin film for realizing the BGA of the second embodiment.
Figure 6:
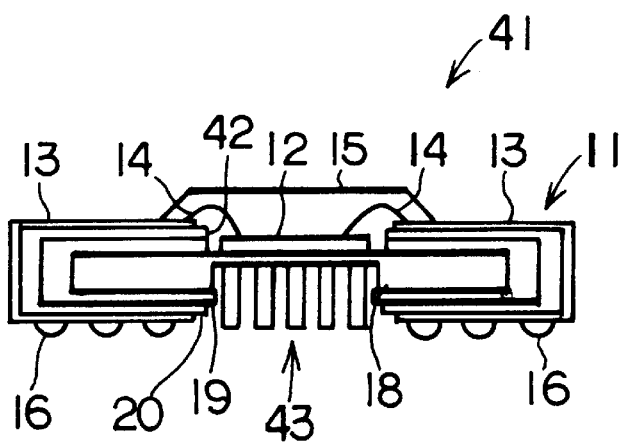
FIG. 6 is a side view illustrating the structure of a BGA in which a heat sink is attached to a metallic plate.

The BGA 41 is designed to allow the semiconductor chip 13 to contact the metallic plate 18 of a higher heat conduction. The metallic plate 18 is expected to promote heat radiation from the semiconductor chip 12 during operation of the semiconductor chip 12. The printed circuit board 11 employed in the BGA 41 can be obtained from the metallic thin film 19, as shown in FIG. 5. The metallic thin film 19 is bored at the aforementioned central square region 32 for receiving the semiconductor chip 12, so that the opening 42 can be defined within the main section 28. Furthermore, if a heat sink 43 is attached to the metallic plate 18, as shown in FIG. 6, heat radiation from the semiconductor chip 12 can be accelerated. A heat pipe or other heat radiation mechanism may be employed in place of the heat sink 43.

Figure 7:
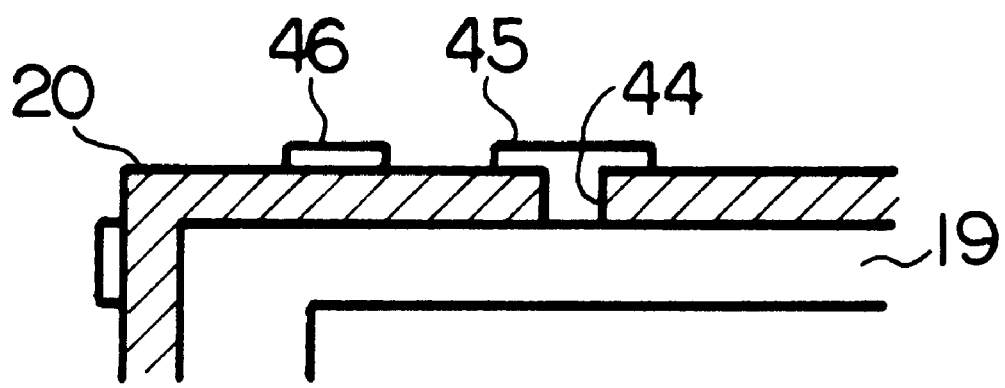
FIG. 7 is an enlarged sectional view partly illustrating the printed circuit board comprising a micro strip line.

The metallic thin film 19 may be utilized as a ground layer in the aforementioned BGA 10, 41. The metallic thin film 19 may, for example, be connected to a ground line 45 provided in the wiring pattern 13 through a via 44 formed in the insulator membrane 20, as shown in FIG. 7. A signal line 46 can be extended between the adjacent ground lines 45, so that the structure similar to a micro strip line can be established. This kind of structure is expected to prevent the signal line 46 from suffering from noise crossing over the adjacent signal lines 46.

What is claimed is:

1. A printed circuit board for a semiconductor package, comprising:
   a substrate having a front surface and a back surface;
   a metallic thin film extending over the front surface and bent around an outer periphery of the front surface so as to reach the back surface;
   an insulation film layered over the metallic thin film; and
   a wiring pattern printed on the insulator film so as to extend over the front and back surfaces of the substrate.

2. The printed circuit board according to claim 1, further comprising a plurality of conductive balls arranged on the back surface of the substrate at pads integral to the wiring pattern.

3. The printed circuit board according to claim 1, wherein the conductive printed pattern includes a plurality of wires designed to begin at a periphery of a central region and to reach corresponding pads for receiving respective conductive balls on the back surface.

4. A semiconductor package comprising:
   a substrate having a front surface and a back surface;
   a metallic thin film extending over the front surface and bent around an outer periphery of the front surface so as to reach the back surface;
   an insulator film layered over the metallic thin film;
   a wiring pattern printed on the insulator film so as to extend over the front and back surfaces of the substrate; and
   a semiconductor chip mounted on the front surface of the substrate and electrically connected to the wiring pattern.

5. The semiconductor package according to claim 4, further comprising a plurality of conductive balls arranged on the back surface of the substrate at pads integral to the wiring pattern.

6. The semiconductor package according to claim 4, wherein the metallic thin film is employed as a ground layer.

7. The semiconductor package according to claim 6, wherein the metallic thin film is connected to the wiring pattern through a via.

8. The semiconductor package according to claim 4, wherein the conductive printed pattern includes a plurality of wires designed to begin at a periphery of a central region and to reach corresponding pads for receiving respective conductive balls on the back surface.

9. A printed circuit board for a semiconductor package, comprising:
   a metallic substrate having a front surface and a back surface;
   an insulator film extending over the front surface and bent around an outer periphery of the front surface so as to reach the back surface;
   an opening defined in the insulator film so as to expose the front surface of the metallic substrate;
   a heat sink attached to the back surface of the metallic substrate; and
   a wiring pattern printed on the insulator film so as to extend over the front and back surfaces.

10. A semiconductor package comprising:
    a metallic substrate having a front surface and a back surface;
    an insulator film extending over the front surface and bent around an outer periphery of the front surface so as to reach the back surface;
    an opening defined in the insulator film so as to expose the front surface of the metallic substrate;
    a wiring pattern printed on the insulator film so as to extend over the front and back surfaces;
    a semiconductor chip mounted on the front surface of the metallic substrate within the opening and electrically connected to the wiring pattern; and
    a heat sink attached to the back surface of the metallic substrate.

11. The semiconductor package according to 10, wherein the conductive printed pattern includes a plurality of wires designed to begin at a periphery of the opening and to reach corresponding pads for receiving respective conductive balls on the back surface.

* * * * *